(12) United States Patent
Kim

(10) Patent No.: US 7,764,557 B2
(45) Date of Patent: Jul. 27, 2010

(54) SENSE AMPLIFIER DRIVING CIRCUIT AND SEMICONDUCTOR DEVICE HAVING THE SAME

(75) Inventor: Chang Il Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 182 days.

(21) Appl. No.: 12/012,939

(22) Filed: Feb. 5, 2008

(65) Prior Publication Data
US 2009/0109776 A1    Apr. 30, 2009

(30) Foreign Application Priority Data
Oct. 29, 2007    (KR) ...................... 10-2007-0109116

(51) Int. Cl.
*G11C 7/02* (2006.01)
(52) U.S. Cl. .................. 365/207; 365/191; 365/189.09; 365/189.05; 365/205
(58) Field of Classification Search ................. 365/207, 365/149, 205, 203, 208, 226, 189.011, 191
See application file for complete search history.

(56) References Cited
U.S. PATENT DOCUMENTS 5,220,527 A * 6/1993 Ohsawa ...................... 365/149
5,555,210 A * 9/1996 Kato ........................... 365/196

2003/0123312 A1    7/2003    Graaff

FOREIGN PATENT DOCUMENTS

KR    10-0172419 B1    10/1998

* cited by examiner

*Primary Examiner*—Pho M Luu
*Assistant Examiner*—Tha-O Bui
(74) *Attorney, Agent, or Firm*—John P. White; Cooper & Dunham LLP

(57) ABSTRACT

The semiconductor memory device blocks a power supply voltage, which is supplied to the sense amplifier, in a write operation, or pull-down drives first and second local I/O lines LIO and LIOB lest they reach the level of ground voltage Vss. Driving time of a write driver of the semiconductor memory device is reduced, and current consumption is reduced. A sense amplifier driving circuit of a semiconductor memory device includes a transfer unit for transferring first and second control signals in response to an enable signal which is activated in a write operation, and a power supply unit for supplying first and second power supply voltages to a sense amplifier in response to the first and second control signals.

16 Claims, 4 Drawing Sheets

SENSE AMPLIFIER DRIVING CIRCUIT AND SEMICONDUCTOR DEVICE HAVING THE SAME

BACKGROUND

The present disclosure relates to a semiconductor memory device and, more particularly, to a sense amplifier driving circuit capable of reducing current consumption in a write operation and a semiconductor memory device having the same.

Generally, a semiconductor memory device such as a DRAM performs read and write operations as essential functions. Read operation is carried out by sensing and amplifying cell data and outputting, the amplified data through a data pad. Particularly, the read operation performs a local data transmission in which the cell data amplified by a sense amplifier are transferred to local I/O lines, a global data transmission in which the data loaded on the local I/O lines are transferred to global I/O lines through an I/O sense amplifier IOSA, and a data pad transmission in which the data loaded on the global I/O lines are transferred to the data pad.

Meanwhile, write operation is performed to store data from the data pad in the memory cell. More concretely, the write operation performs an amplifying operation in which data to be stored are loaded on the bit lines and amplified by a sense amplifier, a driving operation in which the bit line on which the data are loaded is driven based on the data level from the data pad, and a storage operation in which the bit line data driven based on the data level are stored in the memory cell.

FIG. 1 is a block diagram illustrating a write operation of a conventional semiconductor memory device.

Referring to FIG. 1, the conventional semiconductor memory device includes a write driver 1 and a bit line sense amplifier (BLSA) 2. The write driver 1 receives data transferred from a data pad via global I/O lines GIO and GIOB and drives local I/O lines LIO and LIOB. At this time, the BLSA 2 amplifies the data loaded on bit lines. When an output enable signal Yi is activated to a high level, NMOS transistors N1 and N2 are turned on and the data of the local I/O lines LIO and LIOB, which are driven by the write driver 1, are loaded on the bit line via segment I/O lines SIO and SIOB. The data loaded on the bit lines are stored in a memory cell.

SUMMARY

The bit line sense amplifier (BLSA) amplifies and transfers data loaded on bit lines in a read operation so that an I/O sense amplifier IOSA can sense the data. Meanwhile, in a write operation, a write driver receives data transferred from a data pad via global I/O lines GIO and GIOB and drives local I/O lines LIO and LIOB and segment I/O lines SIO and SIOB at a level of a core voltage VCORE or a ground voltage Vss. There is more current consumption in the write operation than in the read operation because the data loaded on the bit lines, which are amplified in the BLSA, are replaced by the data of the segment I/O lines SIO and SIOB.

In accordance with an aspect of the present disclosure, a semiconductor memory device is provided that can reduce current consumption in a write operation through a sense amplifier driving circuit which blocks a driving power supplied to the BLSA in the write operation and the write driver which drives the local I/O lines LIO and LIOB in a level higher than that of a ground voltage Vss.

According to another aspect of the present disclosure, a sense amplifier driving circuit comprises a transfer circuit for transferring first and second control signals in response to an enable signal which is activated in a write operation, and a power supply unit for supplying first and second power supply voltages to a sense amplifier in response to the first and second control signals. The transfer circuit can include a first transfer unit to transfer the first control signal in response to the enable signal, and a second transfer unit to transfer the second control signal in response to the enable signal. The first transfer unit can include a first transfer gate to transfer the first control signal in response to the enable signal, and a second transfer gate to transfer an inverted signal of the first control signal in response to the enable signal. The second transfer unit can include a first transfer gate to transfer the second control signal in response to the enable signal, and a second transfer gate to transfer an inverted signal of the second control signal in response to the enable signal. The first and second control signals are activated in response to an active command.

According to another aspect of the present disclosure, there is provided a sense amplifier driving circuit comprising a first power supply unit for supplying a first power supply voltage to a first node in response to a first control signal, a first transfer unit for transferring a signal on the first node in response to an enable signal which is activated in a write operation to a sense amplifier, a second power supply unit for supplying a second power supply voltage to a second node in response to a second control signal, and a second transfer unit for transferring a signal on the second node in response to the enable signal to the sense amplifier. Each of the first and second transfer units includes a transfer gate which is turned on/off in response to the enable signal.

According to another aspect of the present disclosure, a semiconductor memory device comprises a write driver configured to receive an input signal from first I/O lines and drive second I/O lines in order that the second I/O lines have a voltage level larger than a first power supply voltage, a switching unit for transferring a signal from the second I/O lines to third I/O lines in response to an output enable signal, and a sense amplifier, to which both the first power supply voltage and a second power supply voltage are applied in response to an enable signal which is activated in a write operation, for amplifying a signal on the third I/O line as a bit line sensing operation. The write driver includes a signal generating unit for producing a first pull-up signal and a first pull-down signal in response to a signal from the first I/O lines, a latch unit having a first latch circuit to latch the first pull-up signal and a second latch circuit to latch the second pull-down signal, a delay unit for delaying a signal from the second I/O lines for a predetermined time, and a logic circuit for producing a second pull-down signal to pull-down the second I/O lines by logically combining an output signal of the delay unit and an output signal of the latch unit. The signal generating unit includes a first pull-up device for pull-up driving the first pull-up signal in response to a reset signal, a first pull-down device for pull-down driving the first pull-up signal in response to inverted signals of signals which are loaded on from the first I/O lines, a second pull-up device for pull-up driving the first pull-down signal in response to the reset signal, and a second pull-down device for pull-down driving the first pull-down signal in response to the signals which are loaded on the first I/O lines, wherein the first pull-down device and the second pull-down device are enabled in response to the enable signal. Preferably, the first and second pull-down devices are activated in response to the enable signal. The delay unit includes a first delayer for delaying signals which are loaded on the second I/O lines, and a second delayer for delaying inverted signals of the signals which are loaded on the second I/O lines. The logic unit includes a first logic circuit configured to receive output signals from the first delayer and the first latch circuit and then produce a second pull-down signal to pull-down drive the second I/O lines, and a second logic circuit configured to receive output signals from the second delayer and the second latch circuit and then produce a third pull-down signal to pull-down drive inverted lines of the second I/O lines. Preferably, the first and second logic circuits perform a AND operation and the first voltage has a ground voltage level.

According to still another aspect of the present disclosure, there is provided a semiconductor memory device comprising a write driver configured to receive an input signal from first I/O lines and drive second I/O lines in order that the second I/O lines have a voltage level larger than a first power supply voltage, a switching unit for transferring a signal from the second I/O lines to third I/O lines in response to an output enable signal, a sense amplifier, to which both the first power supply voltage and a second power supply voltage are applied in response to an enable signal which is activated in a write operation, for amplifying a signal on the third I/O line as a bit line sensing operation, a first transfer gate configured to transfer a first control signal in response to the enable signal, a second transfer gate configured to transfer the second control signal in response to an output signal of the first transfer gate, a first power supply unit for supplying the first power supply voltage to the sense amplifier in response to an output signal of the first transfer gate, and a second power supply unit for supplying the second power supply voltage to the sense amplifier in response to an output signal of the second transfer gate.

According to still another aspect of the present disclosure, there is provided a semiconductor memory device comprising a write driver configured to receive an input signal from first I/O lines and drive second I/O lines in order that the second I/O lines have a voltage level larger than a first power supply voltage, a switching unit for transferring a signal from the second I/O lines to third I/O lines in response to an output enable signal, a sense amplifier, to which the first power supply voltage and a second power supply voltage are applied in response to an enable signal which is activated in a write operation, for amplifying a signal on the third I/O line as a bit line sensing operation, a first power supply unit for supplying the first power supply voltage to a first node in response to a first control signal, a first transfer gate for transferring a signal on the first node to the sense amplifier in response to the enable signal, a second power supply unit for supplying the second power supply voltage to a second node in response to a second control signal, and a second transfer gate for transferring a signal on the second node to the sense amplifier in response to the enable signal.

DESCRIPTION OF EXEMPLARY EMBODIMENTS

Hereinafter, the present invention will be described by reference to examples and exemplary embodiments. The examples and exemplary embodiments merely exemplify the present invention, and the scope of the disclosure and appended claims is not limited by the examples and exemplary embodiments.

Figure 1:
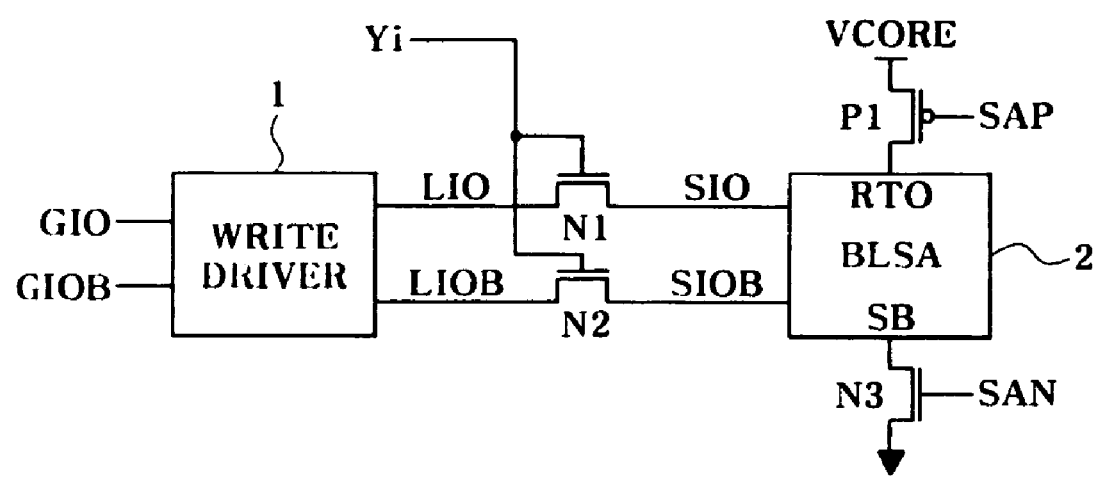
FIG. 1 is a block diagram illustrating a write operation of a conventional semiconductor memory device.
Figure 2:
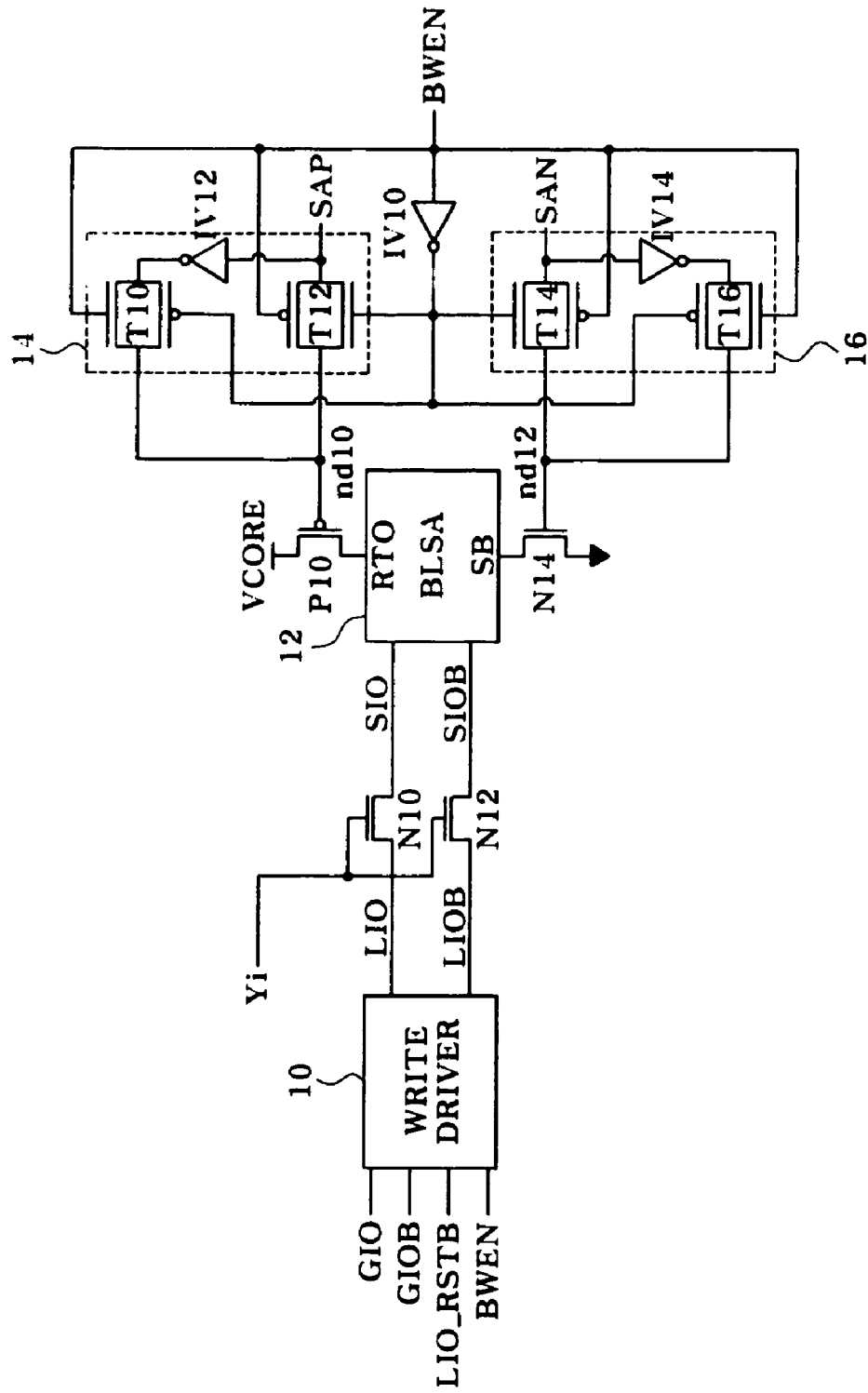
FIG. 2 is a block diagram illustrating a write operation of a semiconductor memory device according to an exemplary embodiment of the present disclosure.

FIG. 2 is a block diagram illustrating a write operation of a semiconductor memory device according to an exemplary embodiment of the present disclosure. Referring to FIG. 2, the semiconductor memory device according to an exemplary embodiment of the present disclosure includes a write driver 10, a bit line sense amplifier 12, a first transfer unit 14 and a second transfer unit 16.

The write driver 10 receives data, which are input from a data pad via global I/O lines GIO and GIOB and drives local I/O lines LIO and LIOB. The write driver 10 will be described later referring to FIG. 4.

The bit line sense amplifier 12 amplifies data loaded on bit lines in a memory cell, by using a core voltage VCORE and a ground voltage Vss which are supplied through a PMOS transistor P10 and an NMOS transistor N14, respectively. In a write operation, the data loaded on the local I/O LIO and LIOB are transferred to segment I/O lines SIO and SIOB so that the transferred data are input into the bit line sense amplifier 12. At this time, the segment I/O lines SIO and SIOB receive data loaded on the local I/O lines LIO and LIOB through NMOS transistors N10 and N12 which are turned on by an output enable signal Yi that is activated in a high level. That is, the data on the local I/O lines LIO and LIOB, which are driven by the write driver 10, are transferred to the segment I/O lines SIO and SIOB through the NMOS transistors N10 and N12 and the transferred data are loaded on the bit lines.

The first transfer unit 14 and the second transfer unit 16 respectively transfer a first control signal SAP and a second control signal SAN which control the supply of the core voltage VCORE and the ground voltage Vss to the bit line sense amplifier 12. The first transfer unit 14 includes transfer gates T10 and T12 which transfer the first control signal SAP in response to an enable signal BWEN that is activated in a write operation. The second transfer unit 16 includes transfer gates T14 and T16 which transfer the second control signal SAN in response to the enable signal BWEN that is activated in the write operation.

Operation of the semiconductor memory device according to the exemplary embodiment of FIG. 2 is described below in detail.

In a write operation, the write driver 10 receives the data which are input through the data pad via the global I/O lines GIO and GIOB and drives the local I/O lines LIO and LIOB. The NMOS transistors N10 and N12 are turned on by the output enable signal Yi which is activated in a high level by an active command so that the data on the local I/O lines LIO and LIOB are transferred to the segment I/O lines SIO and SIOB.

The bit line sense amplifier 12 amplifies the data on the segment I/O lines SIO and SIOB and loads the amplified data on the bit lines. At this time, since the transfer gates T10 and T16 are turned on and the transfer gates T12 and T14 are turned off by the enable signal BWEN which is activated in a high level by a write command, the first control signal SAP, which is activated in a low level in an active operation, is inverted by an inverter IV12 to be transferred, and the second control signal SAN, which is activated in a high level in the active operation, is inverted by an inverter IV14 to be transferred. Thus, the PMOS transistor P10 and the NMOS transistor N14 are turned off so that they prevent the core voltage VCORE and the ground voltage Vss from being supplied to the bit line sense amplifier 12. Meanwhile, in the active operation such as a read operation or a precharge operation, the enable signal BWEN is in a low level. Thus, the transfer gates T10 and T16 are turned off and the transfer gates T12 and T14 are turned on so that the first control signal SAP of a low level and the second control signal SAN of a high level are transferred. Therefore, the PMOS transistor P10 and the NMOS transistor N14 are turned on so that the core voltage VCORE and the ground voltage Vss are supplied to the bit line sense amplifier 12.

As described above, the semiconductor memory device according to the exemplary embodiment of FIG. 2 blocks the supply of the core voltage VCORE and the ground voltage Vss to the bit line sense amplifier 12 in the write operation and then prevents the amplification of the data on the bit lines. Since the non-amplified data on the bit lines can be easily replaced with the data of the segment I/O lines SIO and SIOB having the levels of the core voltage VCORE and the ground voltage Vss, the write driver 10 can drive the local I/O lines LIO and LIOB to the core voltage VCORE and the ground voltage Vss, respectively, only for a section in which the data of the segment I/O lines SIO and SIOB are loaded on the bit lines. Therefore, since the driving time of the write driver 10 can be reduced, the current consumed in a write operation can be reduced.

Figure 3:
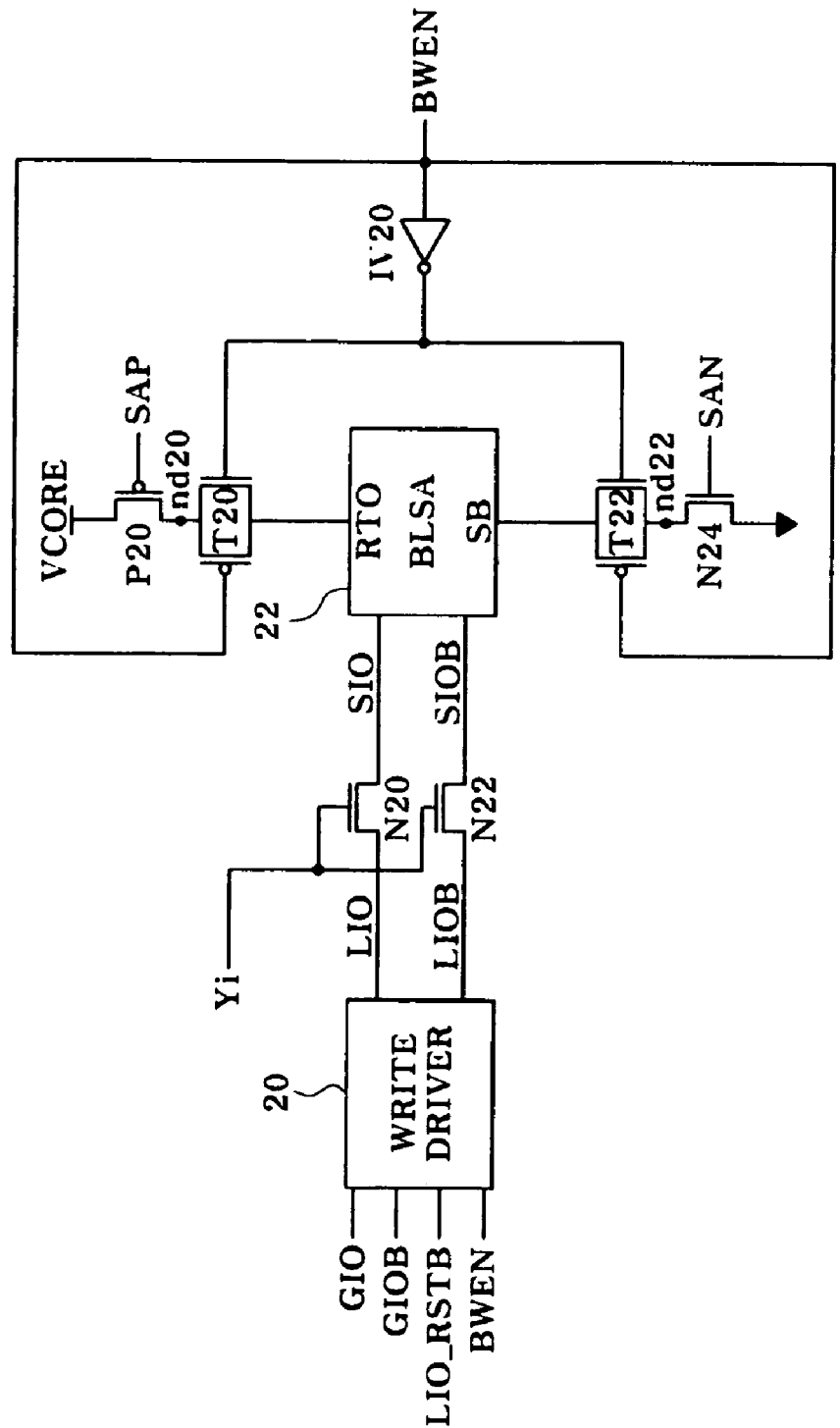
FIG. 3 is a block diagram illustrating a write operation of a semiconductor memory device according to another exemplary embodiment of the present disclosure.

FIG. 3 is a block diagram illustrating a write operation of a semiconductor memory device according to another exemplary embodiment of the present disclosure.

As shown in FIG. 3, the semiconductor memory device according to another exemplary embodiment of the present disclosure includes a write driver 20, a bit line sense amplifier 22, a PMOS transistor P20 which supplies a core voltage VCORE to Node nd20 in response to a first control signal SAP, a transfer gate T20 to supply the core voltage VCORE, which is supplied to Node nd20, to the bit line sense amplifier 22 in response to an enable signal BWEN that is activated in a write operation, an NMOS transistor N24 which discharges a voltage of Node nd22 in response to a second control signal SAN and a transfer gate T22 which connects Node nd22 to the bit line sense amplifier 22 in response to the enable signal BWEN.

The write driver 20 receives data, which are input from a data pad via global I/O lines GIO and GIOB and drives local I/O lines LIO and LIOB. The write driver 20 will be described later referring to FIG. 4.

Operation of the semiconductor memory device according to the exemplary embodiment of FIG. 3 is described below.

In the write operation, the write driver 20 receives the data which are input through the data pad via the global I/O lines GIO and GIOB and drives the local I/O lines LIO and LIOB. The NMOS transistors N20 and N22 are turned on by an output enable signal Yi which is activated in a high level by an active command so that the data on the local I/O lines LIO and LIOB are transferred to the segment I/O lines SIO and SIOB.

The bit line sense amplifier 22 amplifies the data on the segment I/O lines SIO and SIOB and loads the amplified data on the bit lines. At this time, the PMOS transistor P20 is turned on by the first control signal SAP which is activated in a low level at an active operation so that the core voltage VCORE is supplied to Node nd20, and the NMOS transistor N24 is turned on by the second control signal SAN which is activated in a high level in the write operation so that the voltage on Node nd22 is discharged. However, since the transfer gates T20 and T22 are turned off by the enable signal BWEN which is activated in a high level by a write command, they prevent the core voltage VCORE and the ground voltage Vss from being supplied to the bit line sense amplifier 22. Meanwhile, in the active operation such as a read operation or a precharge operation, the enable signal BWEN is in a low level. Thus, the transfer gates T20 and T22 are turned on so that the core voltage VCORE and the ground voltage Vss are supplied to the bit line sense amplifier 22.

As described above, the semiconductor memory device according to the exemplary embodiment of FIG. 3 blocks the supply of the core voltage VCORE and the ground voltage Vss to the bit line sense amplifier 22 in the write operation and then prevents the amplification of the data on the bit lines. Since the non-amplified data on the bit lines can be easily replaced with the data of the segment I/O lines SIO and SIOB having the levels of the core voltage VCORE and the ground voltage Vss, the write driver 20 can drive the local I/O lines LIO and LIOB to the core voltage VCORE and the ground voltage Vss, respectively, only for a section in which the data of the segment I/O lines SIO and SIOB are loaded on the bit lines. Therefore, since the driving time of the write driver 20 can be reduced, the current consumed in the write operation can be reduced.

Figure 4:
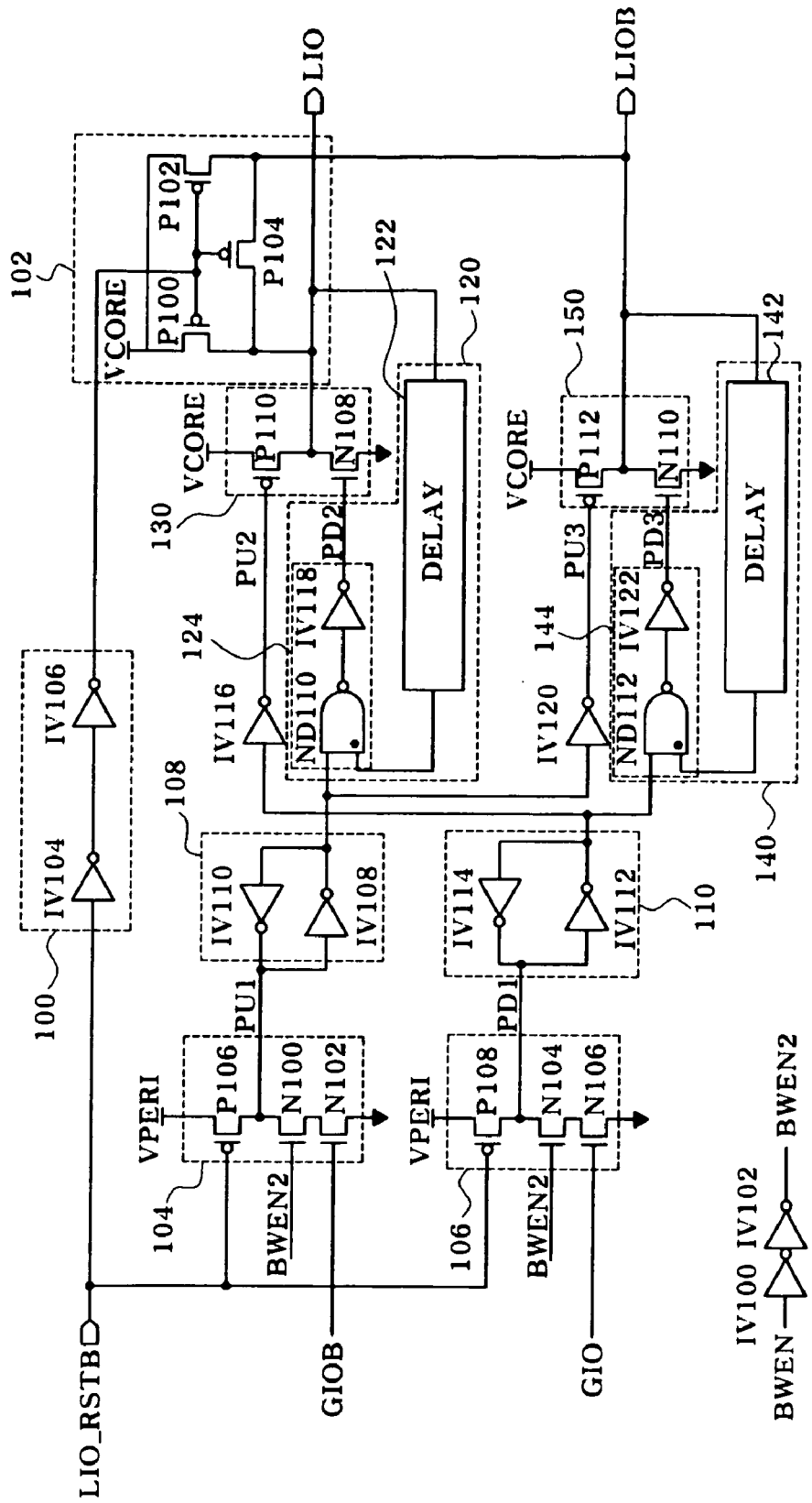
FIG. 4 is a circuit diagram illustrating a write driver of FIGS. 2 and 3.

FIG. 4 is a circuit diagram illustrating the write drivers 10 and 20 of FIGS. 2 and 3 respectively.

Each of the write drivers 10 and 20 includes a precharge unit 102, a first pull-up signal generating unit 104, a first pull-down signal generating unit 106, a first latch unit 108, a second latch unit 110, a second pull-down signal generating unit 120, a first local I/O line driving unit 130, a third pull-down signal generating unit 140 and a second local I/O line driving unit 150.

The precharge unit 102 includes PMOS transistors P100, P102 and P104 which precharge a first local I/O line LIO and a second local I/O line LIOB (an inverted line of the first local I/O line LIO) to the core voltage VCORE in response to a reset signal LIO_RSTB which is activated in a low level before the first and second local I/O lines LIO and LIOB are driven for the write operation.

The first pull-up signal generating unit 104 includes a PMOS transistor P106 which pull-up drives a first pull-up signal PU1 in response to the reset signal LIO_RSTB, an NMOS transistor N102 which pull-down drives the first pull-up signal PU1 in response to the signal of a second global I/O line GIOB (an inverted line of a first global I/O line GIO), and an NMOS transistor N100 which performs a pull-down operation with the NMOS transistor N102 in response to a second enable signal BWEN2 which is produced by delaying a first enable signal BWEN in a predetermined section through inverter chains IV100 and IV102.

The first pull-down signal generating unit 106 includes a PMOS transistor P108 which pull-up drives a first pull-down signal PD1 in response to the reset signal LIO_RSTB, an NMOS transistor N106 which pull-down drives the first pull-down signal PD1 in response to a signal of the first global I/O line GIO, and an NMOS transistor N104 which performs a pull-down operation with the NMOS transistor N106 in response to the second enable signal BWEN2.

The second pull-down signal generating unit 120 includes a delay unit 122 which delays a signal of the first local I/O line LIO for a predetermined section and a first logic unit 124 which receives an output signal of the first latch unit 108 and an output signal of the delay unit 122 and performs an AND operation to generate a second pull-down signal PD2.

The first local I/O line driving unit 130 includes a PMOS transistor P110 which pull-up drives the first local I/O line LIO in response to the second pull-down signal PD2 that is generated by inverting the output signal of the first latch unit 108 and an NMOS transistor N108 which pull-down drives the first local I/O line LIO in response to the second pull-down signal PD2.

The third pull-down signal generating unit 140 includes a delay unit 142 which delays a signal of the second local I/O line LIOB for a predetermined section and a second logic unit 144 which receives an output signal of the second latch unit 110 and an output signal of the delay unit 142 and performs an AND operation to generate a third pull-down signal PD3.

The second local I/O line driving unit 150 includes a PMOS transistor P112 which pull-up drives the second local I/O line LIOB in response to the third pull-down signal PD3 that is generated by inverting the output signal of the second latch unit 110 and an NMOS transistor N110 which pull-down drives the second local I/O line LIOB in response to the third pull-down signal PD3.

Operation of the write driver according to the exemplary embodiment of FIG. 4 is described below.

First, the PMOS transistors P100, P102 and P104 of the precharge unit 102 are turned on in response to the reset signal LIO_RSTB which is activated in a low level before a write operation so that the first and second local I/O lines LIO and LIOB are precharged to the core voltage VCORE. At this time, since the PMOS transistor P106 of the first pull-up signal generating unit 104 and the PMOS transistor P108 of the first pull-down signal generating unit 106 are turned on in response to the reset signal LIO_RSTB, the first pull-up signal PU1 and the first pull-down signal PD1 are in a high level. Also, the second pull-up signal PU2 and the second pull-down signal PD2 are in a high level in response to the first pull-up signal PU1 and the first pull-down signal PD1 of a high level so that the PMOS transistors P110 and P112 are turned off. An output signal of the first logic unit 124 and an output signal of the second logic unit 144 are in a low level so that the NMOS transistors N108 and N110 are turned off. Therefore, the state in which the first and second local I/O lines LIO and LIOB are precharged to the core voltage VCORE is maintained.

Next, when the write command is input so that the second enable signal BWEN2 is activated in a high level, the data of the first and second global I/O lines GIO and GIOB are input through the NMOS transistors N102 and N106. In detail, when the data of a low level are input through the data pad, the first global I/O line GIO is in a low level and the second global I/O line GIOB is in a high level. Thus, since the first pull-up signal PU1 is in a low level and the first latch unit 108 outputs a signal of a high level, the first logic unit 124, which receives an output signal of the delay unit 122 that delays a signal of the first local I/O line LIO precharged in a high level in a predetermined section, generates the second pull-down signal PD2 of a high level. The second pull-down signal PD2 of a high level turns on the NMOS transistor N108 to pull-down drive the first local I/O line LIO. At this time, since the signal of the first local I/O line LIO, pull-down driven in a low level, is fed back to the first logic unit 124 through the delay unit 122, the second pull-down signal PD2 is in a high level. Thus, the NMOS transistor N108 is turned off so that the pull-down driving of the first local I/O line LIO is terminated.

Meanwhile, when the data of a high level are input through the data pad, the first global I/O line is in a high level and the second global I/O line is in a low level. Thus, since the first pull-down signal PD1 is in a low level and the second latch unit 110 outputs a signal of a high level, the second logic unit 144, which receives an output signal of the delay unit 142 that delays a signal of the second local I/O line LIOB precharged in a high level in a predetermined section, generates the third pull-down signal PD3 of a high level. The third pull-down signal PD3 of a high level turns on the NMOS transistor N110 to pull-down drive the second local I/O line LIOB. At this time, since the signal of the second local I/O line LIOB, pull-down driven in a low level, is fed back to the second logic unit 144 through the delay unit 142, the third pull-down signal PD3 is in a low level. Thus, the NMOS transistor N110 is turned off so that the pull-down driving of the second local I/O line LIOB is terminated.

The write driver in the exemplary embodiments described above prevents the first and second local I/O lines LIO and LIOB from being pull-down driven up to the ground voltage Vss when the first and second local I/O lines LIO and LIOB are driven based on the data input via the first and second global I/O lines GIO and GIOB. That is, in case that the first and second local I/O lines LIO and LIOB are pull-down driven, the pull-down driving is terminated until the first and second local I/O lines LIO and LIOB are pull-down driven to the ground voltage Vss. Therefore, since the driving time of the write driver is reduced, the current consumption is also reduced.

Also, the semiconductor memory device in the exemplary embodiments described above blocks the power supply voltage, which is supplied to the sense amplifier, in the write operation, or pull-down drives the first and second local I/O lines LIO and LIOB lest they reach the level of the ground voltage Vss. Therefore, since the driving time of the write driver is reduced, the current consumption is reduced.

While the present invention has been described with respect to particular examples and exemplary embodiments, it will be apparent to those skilled in the art that various changes and modifications may be made without departing from the spirit and scope of the disclosure and the following claims. For example, elements and/or features of the different examples and illustrative embodiments may be combined with each other and/or substituted for each other within the scope of this disclosure and the appended claims.

The present disclosure claims priority to Korean application number 10-2007-0109116, filed on Oct. 29, 2007, the entire contents of which are incorporated herein by reference.

What is claimed is:

1. A sense amplifier driving circuit comprising:
    a first transfer unit comprising a first transfer gate configured to transfer a first control signal in response to an enable signal and a second transfer gate configured to transfer an inverted signal of the first control signal in response to the enable signal;
    a second transfer unit configured to transfer a second control signal in response to the enable signal; and
    a power supply circuit configure to supply first and second power supply voltages to a sense amplifier in response to the first and second control signals.

2. The sense amplifier driving circuit of claim 1, wherein the second transfer unit includes:
    a first transfer gate configured to transfer the second control signal in response to the enable signal; and
    a second transfer gate configured to transfer an inverted signal of the second control signal in response to the enable signal.

3. The sense amplifier driving circuit of claim 1, wherein the first and second control signals are activated in response to an active command.

4. The sense amplifier driving circuit of claim 1, wherein the power supply circuit includes:

a first power supply unit for supplying the first power supply voltage to the sense amplifier in response to an output signal of the first transfer unit; and a second power supply unit for supplying the second power supply voltage to the sense amplifier in response to an output signal of the second transfer unit.

5. A semiconductor memory device comprising:

a write driver configured to receive an input signal from first I/O lines and drive second I/O lines;

a switching unit for transferring a signal from the second I/O lines to third I/O lines in response to an output enable signal; and a sense amplifier, to which both of the first power supply voltage and a second power supply voltage are applied in response to an enable signal which is activated in a write operation, for amplifying a signal on the third I/O lines as a bit line sensing operation, wherein the write driver stops a pull-down driving of second I/O lines before second I/O lines are driven to a first power supply voltage.

6. The semiconductor memory device of claim 5, wherein the write driver includes:

a signal generating unit for producing a first pull-up signal and a first pull-down signal in response to a signal from the first I/O lines;

a latch unit having a first latch circuit to latch the first pull-up signal and a second latch circuit to latch the first pull-down signal;

a delay unit for delaying a signal from the second I/O lines for a predetermined time; and a logic circuit for producing a second pull-down signal to pull-down the second I/O lines by logically combining an output signal of the delay unit and an output signal of the latch unit.

7. The semiconductor memory device of claim 6, wherein the signal generating unit includes:

a first pull-up device for pull-up driving the first pull-up signal in response to a reset signal;

a first pull-down device for pull-down driving the first pull-up signal in response to inverted signals from the first I/O lines;

a second pull-up device for pull-up driving the first pull-down signal in response to the reset signal; and a second pull-down device for pull-down driving the first pull-down signal in response to first signals from the first I/O lines, wherein the first pull-down device and the second pull-down device are enabled in response to the enable signal.

8. The semiconductor memory device of claim 7, wherein the delay unit includes:

a first delayer for delaying signals which are loaded on the second I/O lines; and a second delayer for delaying inverted signals of the signals which are loaded on the second I/O lines.

9. The semiconductor memory device of claim 8, wherein the logic unit includes:

a first logic circuit configured to receive output signals from the first delayer and the first latch circuit and then produce a second pull-down signal to pull-down drive the second I/O lines; and a second logic circuit configured to receive output signals from the second delayer and the second latch circuit and then produce a third pull-down signal to pull-down drive inverted lines of the second I/O lines.

10. The semiconductor memory device of claim 5, wherein the first power supply voltage is a ground voltage.

11. The semiconductor memory device of claim 5, further comprising:

a first transfer unit for transferring a first control signal in response to an enable signal which is activated for a write operation;

a second transfer unit for transferring a second control signal in response to the enable signal;

a first power supply unit for supplying the first power supply voltage to the sense amplifier in response to the enable signal; and a second power supply unit for supplying the second power supply voltage to the sense amplifier in response to an output signal of the second transfer unit.

12. The semiconductor memory device of claim 11, wherein the first transfer unit includes:

a first transfer gate for transferring the first control signal in response to the enable signal; and a second transfer gate for transferring an inverted signal of the first control signal in response to the enable signal.

13. The semiconductor memory device of claim 11, wherein the second transfer unit includes:

a first transfer gate for transferring the second control signal in response to the enable signal; and a second transfer gate for transferring an inverted signal of the second control signal in response to the enable signal.

14. The semiconductor memory device of claim 11, wherein the first and second control signals are activated in response to an active command.

15. The semiconductor memory device of claim 5, further comprising:

a first power supply unit for supplying the first power supply voltage to a first node in response to a first control signal; and a first transfer unit for transferring a signal on the first node to the sense amplifier in response to the enable signal;

a second power supply unit for supplying the second power supply voltage to a second node in response to a second control signal; and a second transfer unit for transferring a signal on the second node in response to the enable signal.

16. The semiconductor memory device of claim 15, wherein the first and second control signals are activated in response to an active command.

* * * * *